United States Patent [19]

Porazhinsky et al.

[11] 4,084,077
[45] Apr. 11, 1978

[54] CATHODE ASSEMBLY OF ELECTRON BEAM WELDING GUN

[76] Inventors: Igor Antonovich Porazhinsky, Rusanovskaya naberezhnaya, 24/51, kv. 46; Alexei Pavlovich Obolonsky, ulitsa Bereznyakovskaya, 24, kv. 127; Anatoly Grigorievich Ivaschenko, ulitsa Prazhskaya, 3, kv. 411; Evgeny Ivanovich Istomin, ulitsa Oktyabrskoi revoljutsii, 22/7, kv. 20; Alexandr Fedorovich Ivanenko, ulitsa Zodchikh, 62, kv. 339; Leonid Pavlovich Strekal, ulitsa Gorkogo, 138, kv. 8; Adolf Alfonsovich Vasiliev, ulitsa Erevanskaya, 8a, kv. 36; Boris Denisovich Vaskin, Andreevsky spusk, 2, kv. 26, all of Kiev, U.S.S.R.

[21] Appl. No.: 795,505

[22] Filed: May 10, 1977

[51] Int. Cl.² ............................................. B23K 9/00
[52] U.S. Cl. ........................... 219/121 EB; 313/237; 313/337
[58] Field of Search ................ 219/121 EB, 121 EM; 313/337, 346 DC, 346 R, 236, 237

[56] References Cited

U.S. PATENT DOCUMENTS 3,259,784 7/1966 Vogel ........................ 313/337 X

FOREIGN PATENT DOCUMENTS 97,488 3/1961 Netherlands ...................... 313/337

Primary Examiner—J. V. Truhe
Assistant Examiner—Fred E. Bell
Attorney, Agent, or Firm—Fleit & Jacobson

[57] ABSTRACT

Disclosure is made of a cathode assembly of an electron beam welding gun, wherein in a holder's sleeve, which is mounted an a current lead, there is arranged a disc cathode. Arranged in the cavity of said current lead, coaxially therewith, are two more current leads. The latter two current leads are concentric to each other; in said current leads there is secured a flat coil with a central end bent at a perpendicular to the coil's plane. Said central end, bent at a perpendicular to the coil's plane, is corrugated along its axis and installed in a current lead constructed as a rod having a stepped cavity extending along the rod's axis. The outer turn of said coil is arranged in another current lead which envelops the above-mentioned current lead and is constructed as a tube with an internal annular recess at its end, which receives the outer turn of said coil.

1 Claim, 3 Drawing Figures

CATHODE ASSEMBLY OF ELECTRON BEAM WELDING GUN

The present invention relates to electron beam welding guns, more specifically, to cathode assemblies of electron beam welding guns with disc cathodes heated by means of electron bombardment with the aid of coiled cathodes. The invention is applicable in different fields of electron beam technology.

Today, thermionic cathodes are commonly incorporated in cathode assemblies of electron beam welding guns. This applies, for instance, to electron bombardment-heated cathodes. In most cases, the thermionic cathodes of electron beam welding guns are disc cathodes of lanthanum hexaborine ($LaB_6$) or tantalum. Electron bombardment heating is normally carried out with the aid of a straight-channel tungsten coil secured in respective current leads.

The use of a straight-channel coil of tantalum for the purposes of electron bombardment heating is impractical, keeping in mind the fact that tantalum is more expensive than platinum, whereas there is only a slight difference between the emission constants of tungsten and tantalum.

Electron beam welding guns operate under the effects of vaporization of the material being welded, intensified ion bombardment, the presence of air in the welding chamber, etc. Such severe operating conditions shorten the life of cathodes and heaters and make it necessary to provide dismountable cathode assemblies for electron beam welding guns.

Expected reliability of the straight-channel coil used for electron bombardment of the disc cathode of the welding gun's cathode assembly is determined by both the design of the coil and the manner in which it is secured to the current leads.

There is another important consideration. Normally, electron beam welding guns intended for job-lot production are not provided with spare parts, such as cathodes and heaters; on the other hand, a faster replacement of a cathode or heater would reduce the down time of welding guns.

There is known a cathode assembly of an electron beam welding gun, comprising a disc cathode secured in a holder's sleeve, and a coil secured in current leads and intended for electron bombardment heating. The wire coil of this known cathode assembly is a flat Archimedean spiral of tungsten, whose ends change into two cylindrical coils, upper and lower, which are arranged on one side of he flat spiral's plane and intended to be secured in respective current leads.

In the known cathode assembly, the current lead to secure the internal cylindrical portion of the heater's coil is a thin rod of a refractory material, for example, molybdenum, and is provided with a thread at its end, whose pitch corresponds to that of the internal cylindrical portion of the coil.

In order to secure the external cylindrical portion of the coil, the outer current lead of the known cathode assembly is constructed as a tube with a threaded portion.

The known cathode assembly under review has the following disadvantages:
the complicated shape of the heater's coil, which involves difficulties in its manufacture;
unreliable current leads, which applies, in particular, to the current lead for securing the internal cylindrical portion of the coil (to avoid a reduction in the useful working surface of the coil, the current lead to secure the internal portion of the coil must be thin and threaded; the high working temperature of the coil, which is 2,600° to 2,700° K, accounts for a short service life of the current leads);
prolonged replacement of a burnt coil, which necessitates the removal of the old coil and careful handling of the thin central lead; the complicated configuration of the heater's coil is another difficulty involved in the coil replacement.

It is an object of the present invention to provide a cathode assembly of an electron beam welding gun, which would raise the reliability of the current leads.

It is another object of the invention to simplify the manufacture of the current leads.

It is still another object of the invention to simplify the configuration of the heater's coil and cut down the time of replacing a disabled coil of the heater.

The foregoing objects of the present invention are attained by providing a cathode assembly of an electron beam welding gun, comprising a disc cathode secured in a holder's sleeve, and a heating coil arranged in current leads, which cathode assembly is characterized, according to the invention, by that the coil is flat and has a central end bent at a perpendicular to the coil's axis, which end is corrugated along its axis, and by that one of the current leads, wherein there is installed the bent central end, is constructed as a rod with a stepped cavity arranged along the rod's axis, whereas the other current lead is constructed as a tube with an internal annular recess at its end, which receives the outer turn of the heater's coil.

The proposed cathode assembly of an electron beam welding gun is marked by the simplicity of the heater's coil which is easy to manufature. The winding of the flat heating coil with a bent central end is carried out with the aid of simple attachments on any type of a lathe or drilling machine with a high reproducibility of the geometrical dimensions.

The central bent end is corrugated and is thus held by the elastic and friction forces in the current lead which is constructed as a rod with a stepped cavity arranged along the rod's axis. The central end may be corrugated manually, prior to installing the coil in the cathode assembly.

The current leads of the heater's coil of the proposed cathode assembly are simple in design and easy to manufacture. The absence of locking and threaded members to secure the heater's coil accounts for a prolonged service life and reliability of the current leads.

The operation of replacing a burnt coil is simple and does not require much time.

Other objects and advantages of the present invention will be more readily understood from the following detailed description of a preferred embodiment thereof to be read in conjunction with the accompanying drawings, wherein.

Figure 1:
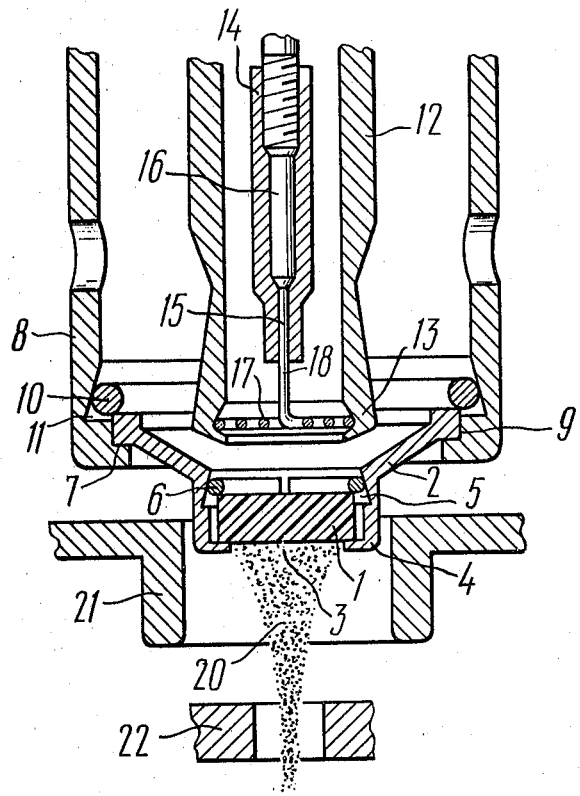
FIG. 1 is a section of the proposed cathode assembly of an electron beam welding gun.

Referring now to the attached drawings, the proposed cathode assembly of an electron beam welding gun comprises a disc cathode 1 (FIG. 1) which is a pellet, for example, of lanthanum hexaborine or tantalum. The cathode 1 is arranged in a sleeve of a holder 2 so that there is a clearance between said cathode 1 and the walls of the sleeve. The sleeve of the holder 2 is a refractory material possessing a low emissivity, for example, molybdenum.

The holder 2 has a central orifice 3 provided in a bottom 4 of the sleeve. The size of the central orifice 3 determines the dimensions of the emitting surface of the disc cathode 1. To provide for different ranges of the electron beam current, the cathode assenbly has two or three holders 2 with different diameters of the central orifice 3. On the internal surface of the sleeve of the holder 2 there is provided a cone-shaped recess 5 which broadens towards the disc cathode 1 and serves to receive a split ring 6 of a refractory material, for example, tungsten or molybdenum. The split ring 6 exerts a uniformly distributed pressure on the disc cathode 1 to press it against the bottom 4 of the holder 2.

The holder 2 is designed so that the plane, in which the holder 2 adjoins a seat 7 in a current lead 8 of the cathode, is parallel with the plane of the bottom 4 of the holder 2, whereto there is pressed the cathode 1. A shoulder 9 of the holder 2, which serves for centrering the holder 2 in the seat 7 of the cathode's current lead 8, is coaxial with the axis of the central orifice 3 provided in the bottom 4 of the sleeve. The positioning of these components remains intact in the course of operation, which accounts for constant geometrical parameters of the electron-optical system of the cathode assembly in the course of operation and in case of a replacement of the disabled disc cathode 1.

The holder 2 is arranged in the cathode current lead 8. The latter is tubular and manufactured from stainless steel. The holder 2 is pressed against the seat 7 of the cathode 8 by a split ring 10 of a refractory material, for example, tungsten or molybdenum. The split ring 10 is received in an internal cone-shaped recess 11 of the cathode current lead 8.

The split rings 6 and 10 ensure reliable operation of the electron beam welding gun in any position.

Arranged inside and coaxialy with the cathode current lead 8 is a tubular current lead 12 made, for example, of molybdenum. The end of the current lead 12, which faces the holder 2, is provided with an annular recess 13. Arranged inside coaxially with the current lead 12 is a current lead 14 made, for example, of molubdenum. The current lead 14 is a hollow rod with a stepped internal cavity including a smaller-diameter channel 15 and a greater-diameter channel 16. The channel 15 is next to the holder 2.

Figure 3:
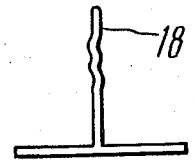
FIG. 3 is a side view of the heating coil.
Figure 2:
FIG. 2 is a plan view of the heating coil.

The disc cathode 1 is heated by a flat coil 17 (FIGS. 1 and 2) with a central corrugated end 18 (FIGS. 1 and 3) bent at a perpendicular to the plane of the coil 17. The coil 17 is of an appropriately selected material, for example, tungsten.

The central corrugated end 18 of the flat coil 17 (FIG. 1) is inserted in the smaller-diameter channel 15 of the hollow rod of the current lead 14. An outer turn 19 (FIG. 2) of the flat coil 17 is received in the internal annular recess 13 (FIG. 1) provided at the end of the current lead 12; the necessary electric contact is provided for.

A burnt coil is replaced as follows.

The cathode current lead 8, the cathode holder 2 and other components mounted on said lead 8 are removed, thus providing access to the current leads 14 and 12. The fragile pieces of the burnt coil 17 are removed from the annular recess 13 with the aid of a sharp tool, for example, scalpel. If part of the end 18 of the burnt flat coil 17 protrudes from the channel 15 of the current lead 14, it is removed by some suitable tool, for example, forceps. Of the end 18 of the burnt flat coil 17 is all inside the channel 15, it is pushed through the channel 15 into the channel 16 of the current lead 14 with the corrugated central end 18 of the new flat coil 17. The operation requires very little time. Thus, the greater-diameter channel 16 of the current lead 14 serves as a container for fragile pieces of the ends 18 of burnt coils. From time to time, normally, after replacing a few scores of burnt coils, the current lead 14 is removed and freed from coil fragments, whereupon it is reinstalled in place.

The outer turn 19 (FIG. 3) of the freshly installed flat coil 17 is iserted into the annular recess 13 (FIG. 1), for example, with the aid of a scalpel.

The proposed cathode assembly of an electron beam welding gun operates as follows.

Filament current is applied to the flat coil 17 to heat it to a working temperature of 2,500° to 2,600° K, whereupon there starts emission of electrons from the surface of said coil 17. The electrons are accelerated by an accelerating d.c. voltage of 800 to 1,000 V (the plus terminal of the accelerating voltage source is connected to the disc cathode 1, whereas the minus terminal is connected to the flat coil 17). The electrons bombard the surface of the disc cathode 1 and heat it to a working temperature.

An electron beam 20, emitted by the disc cathode 1, is shaped by the central orifice 3, provided in the bottom 4 of the holder 2, and focused with the aid of an electrode 21 and an anode 22.

1. A cathode assembly of an electron beam welding gun, comprising: a current lead defining a cavity, wherein there is secured a holder housing a sleeve; a disc cathode installed in said holder's sleeve; two more current leads arranged concentrically with respect to each other, said current leads being placed in the cavity of said former current lead, coaxially with it; a flat coil arranged in said concentric current leads, said flat coil having a central end bent at a perpendicular to the coil's axis, said central bent end being corrugated along its axis and installed in one of said current leads which one lead is constructed as a rod with a stepped cavity extending along the rod's axis, whereas the other current lead envelops said current lead and is constructed as a tube with an internal annular recess at its end to receive an outer turn of said flat coil.

* * * * *